United States Patent
Cai et al.

(10) Patent No.: US 10,284,824 B2
(45) Date of Patent: May 7, 2019

(54) OPTO-ELECTRONIC STACKED SENSOR

(71) Applicant: Caeleste CVBA, Mechelen (BE)

(72) Inventors: Gaozhan Cai, Antwerp (BE); Bart Dierickx, Edegem (BE); Bert Luyssaert, Ghent (BE); Peng Gao, Korbeek-Lo (BE)

(73) Assignee: Caeleste CVBA, Mechelen (BE)

( * ) Notice: Subject to any disclaimer, the term of this patent is extended or adjusted under 35 U.S.C. 154(b) by 0 days.

(21) Appl. No.: 15/876,399

(22) Filed: Jan. 22, 2018

(65) Prior Publication Data

US 2018/0227549 A1    Aug. 9, 2018

Related U.S. Application Data

(60) Provisional application No. 62/448,724, filed on Jan. 20, 2017.

(30) Foreign Application Priority Data

May 26, 2017 (EP) .................................. 17173143

(51) Int. Cl.
*H04N 5/378* (2011.01)
*H04N 7/22* (2006.01)
(Continued)

(52) U.S. Cl.
CPC ........... *H04N 7/22* (2013.01); *G02B 6/12002* (2013.01); *H01L 27/1464* (2013.01);
(Continued)

(58) Field of Classification Search
CPC .................................................... H04N 5/378
(Continued)

(56) References Cited

U.S. PATENT DOCUMENTS

| 7,324,716 B2* | 1/2008 | Epitaux | G02B 6/4204 385/14 |
| 8,704,923 B2* | 4/2014 | Ogasawara | H01L 27/14609 348/294 |
| 8,773,562 B1* | 7/2014 | Fan | H01L 27/14643 348/308 |

OTHER PUBLICATIONS

Arai et al., "A 1.1μm 33Mpixel 240fps 3D-Stacked CMOS Image Sensor with 3-Stage Cyclic-Based Analog-to-Digital Converters," IEEE Internatinoal Solid-State Circuits Conference, 2016, 3 Pages.
Deptuch et al., "Fully 3-D Integrated Pixel Detectors for X-Rays," IEEE Transactions on Electron Devices, vol. 63, No. 1, Jan. 2016, pp. 205-214.
Deptuch et al., "Vertically Integrated Circuits at Fermilab," IEEE Transactions on Nuclear Science, vol. 57, No. 4, Aug. 2010, pp. 2178-2186.

(Continued)

*Primary Examiner* — Anthony J Daniels
(74) *Attorney, Agent, or Firm* — Workman Nydegger

(57) ABSTRACT

A stacked image sensor comprises an array of tiles, each comprising a sensor array layer tile comprising a plurality of sensing elements for receiving radiation, one or more electronics layer tiles comprising at least one read-out circuit, connected to at least one subgroup of sensing elements of the sensor array layer tile, a photonics layer tile comprising at least one waveguide and one or more modulators, each connected to the one or more electronics layer tiles. The modulators are adapted for modulating an optical signal travelling within the at least one waveguide. The electronics layer tile comprises at least one driver for driving an optical modulator in the photonics layer tile in accordance with the signals received in each sensing element of the sensor array layer tile. At least one of the layer tiles (sensor array layer, electronics layer and/or photonics layer tiles) is implemented in a single integrated circuit.

16 Claims, 6 Drawing Sheets

(51) Int. Cl.
*G02B 6/12* (2006.01)
*H01L 27/146* (2006.01)
*H01L 31/024* (2014.01)
*H04N 5/369* (2011.01)

(52) U.S. Cl.
CPC .. *H01L 27/14623* (2013.01); *H01L 27/14634* (2013.01); *H01L 27/14636* (2013.01); *H01L 27/14643* (2013.01); *H01L 31/024* (2013.01); *H04N 5/3696* (2013.01); *H04N 5/378* (2013.01); *H04N 5/379* (2018.08); *G02B 2006/12138* (2013.01); *G02B 2006/12142* (2013.01)

(58) Field of Classification Search
USPC .................................................. 348/294, 311
See application file for complete search history.

(56) References Cited

OTHER PUBLICATIONS

Kondo et al., "A 3D Stacked CMOS Image Sensor with 16Mpixel Global-Shutter Mode and 2Mpixel 10000fps Mode Using 4 Million Interconnections," Symposium on VLSI Circuits Digest of Technical Papers, 2015, 2 Pages.

Liu et al., "Ultra-Compact 320 Gb/S and 160 Gb/S WDM Transmitters Based on Silicon Microrings," Optical Society of America, 2014, 3 Pages.

Settaluri et al, "Demonstration of an Optical Chip-to-Chip Link in a 3D Integrated Electronic-Photonic Platform," IEEE, 2015, pp. 156-159.

Timurdogan et al., "An Ultra Low Power 3D Integrated Intra-Chip Silicon Electronic-Photonic Link," Optical Society of America, 2015, 3 Pages.

* cited by examiner

OPTO-ELECTRONIC STACKED SENSOR

FIELD OF THE INVENTION

The invention relates to the field of light sensors and imagers. More specifically it relates to a 3D integrated sensor stack.

BACKGROUND OF THE INVENTION

High speed imaging, for example for scientific applications, is difficult to obtain with traditional image sensors. Back-side illumination (BSI) is a preferred type of CMOS image sensors, because BSI sensors do not have wiring or electronics in front of the photosensitive surface, but behind it. The absence of wiring in front of the photosensitive surface increases the amount of light reaching this photosensitive surface. Thus, BSI sensor are preferred for low illumination conditions and high-speed imaging.

However, power lines, select lines, data lines, switches and related electronic elements for driving and reading the sensing elements are usually laid out at the sides and in between the sensing elements, such as e.g. photodiodes. This reduces the amount of sensing elements that can be laid out in a sensor per unit area. In order to maximize the sensing area on an image sensor, vertical integration (3D IC) technology was developed. 3D stacking provides separation between pixel array and peripheral circuits in different stacked layers, so the surface of the pixel array is effectively utilized. However, the density of connections increases, and row and column circuits may overlap. Moreover, this technology requires advanced and high precision wafer thinning, fabrication of deep and through-silicon vias (TSV), and bonding, e.g. fusion bonding, which should be both easy to implement in a manufacture process and suitable for the particular sensor. Back-side thinning and patterning of wafers is required, as well as back-side metallization for connections between layers, etc. Vias of different diameters can be combined for communication at pad level or between individual blocks on different layers. Shorter interconnects are thereby obtained, which reduces parasitic signals and space required. Thus, 3D stacks can be used for sensors with high spatial resolution.

The document "A 3D stacked CMOS image sensor with 16M pixel global-shutter mode and 2M pixel 10000 fps mode using 4 million interconnections", by Toni Kondo (Symposium on VLSI, 2015) shows that vertical integration provides global shutter function, and at the same time shielding of the electronics, from both light and photo-generated carriers. It shows a pixel circuit in a bottom layer with a clamp capacitor and a clamp transistor shared by four sample hold capacitors, instead of the usual arrangement of three clamp transistors, thus reducing area. Microbumps are used as interconnection between the pixels and substrates, and the order of millions of bumps can be obtained. The electronic treatment of data is the main speed bottleneck for data processing. Some studies show the possibility of integrating CMOS chips with optical links, using low parasitic capacitance through oxide vias. Although the data transmission is fast and with low energy, the addressing, readout and processing speed is still limited by the electronics of the pixel and readout circuits.

SUMMARY OF THE INVENTION

It is an object of embodiments of the present invention to provide a 3D sensor stack with opto-electronic link with fast readout and large sensing area.

It is an advantage of embodiments of the present invention that parallelization can be obtained, advantageously increasing the sensor speed in a sensor with an arbitrary number of sensing elements, up to all sensing elements in a wafer. It is a further advantage that complexity and power consumption can be reduced. It is a further advantage that digital information can be encoded in a waveguide with modulators. It is a further advantage that frame rate can be increased in a compact device, as electronic interconnects are reduced thanks to the optical links.

In embodiments of the present invention, a stacked image sensor is provided. The stacked image sensor comprises an array of tiles. Each tile comprises:
a sensor array layer tile comprising a plurality of sensing elements for receiving radiation,
one or more electronics layer tiles comprising at least one read-out circuit, connected to at least one subgroup of sensing elements of the sensor array layer tile, and
a photonics layer tile comprising at least one waveguide, and one or more modulators, each connected to the one or more electronics layer tiles, the modulators being adapted for modulating an optical signal travelling within the at least one waveguide, Each electronics layer tile comprises at least one driver for driving an optical modulator in the photonics layer tile in accordance with the signals received in each sensing element of the sensor array layer tile. In accordance with the present invention, the tiles of at least one of the sensor array layer, the electronics layer or the photonics layer of the stacked image sensor are implemented in a single integrated circuit. In other words, the tiles of at least one of the layers are integrated in a single layer (e.g. in a single substrate, for example in a single wafer).

In some embodiments of the present invention, the at least one waveguide further comprises optical couplers, such as grating couplers, for coupling radiation to and from at least one radiation carrier (e.g. an optical fiber). It is an advantage of embodiments of the present invention that a modular device can be obtained. For example, such device may advantageously be interchangeable with various input and output optical fibers. In particular, some embodiments of the present invention comprise at least one waveguide integrated in a photonics platform, further comprising grating couplers for incoupling radiation from an input optical fiber and for outcoupling radiation into an output optical fiber. It is an advantage of embodiments of the present invention that the photonics array, including at least one waveguide and modulator, can be integrated in a single platform, and connections between arrays can be easily made.

In some embodiments of the present invention, each tile of the array comprises an electronics layer tile stacked on top of its respective photonics layer tile in equally sized, aligned tiles. It is an advantage of embodiments of the present invention that electronic-optical links can be provided in a simple way.

In some embodiments of the present invention each tile of the array comprises a sensor array layer tile stacked on top of its respective electronics layer tile in equally sized, aligned tiles. It is an advantage of embodiments of the present invention that existing addressing schemes can be used. In particular embodiments of the present invention, the sensor array layer tile comprises less connections to the electronics layer tile than the total number of pixels in the sensor array layer tile. Hence, two or more pixels of the sensor array layer tile share a connection to the electronics layer tile, each pixel comprising select switch means for pixel addressing from the electronics layer tile. It is an advantage of embodiments of the present invention that less connections are needed, reducing the wiring and interconnect density between the layers.

In some embodiments of the present invention, the sensor further comprises connections to row and column drive lines of the sensing elements inside the sensing array layer tiles. In further embodiments, the sensing elements cover substantially the whole area of a surface of the respective sensor array layer tile. It is an advantage of embodiments of the present invention that radiation sensing efficiency per area unit, because lateral interconnects and peripherals (such as select transistors, column and row wiring and connections, data processing circuits, etc.) do not need to be included on the surface area of the tile which receives radiation, so there is no reduction of sensing area.

In some embodiments of the present invention, the electronic layers are stacked and directly bonded to the respective sensor array layers and to the respective photonics layers.

It is an advantage of embodiments of the present invention that a 3D integrated stacked sensor can be manufactured using known and optimized industrial routes.

In some embodiments of the present invention, the one or more modulators are ring resonator modulators (RRM), Mach-Zehnder modulators (MZM), or a combination thereof.

It is an advantage of embodiments of the present invention that a high power in a small area can be obtained. It is a further advantage that the performance is not limited in bandwidth, and maximum power levels can be high. It is a further advantage that RRMs can be easily integrated and obtained by CMOS processing. It is a further advantage that multiplexing, e.g. wavelength-division multiplexing, can be easily implemented.

In some embodiments of the present invention, the photonics array tile is implemented in a silicon-on-insulator photonics wafer. It is an advantage of embodiments of the present invention that the waveguide and modulators can be integrated in the same platform with well-known manufacturing routes.

In some embodiments of the present invention, the at least one driver for driving an optical modulator comprises converters for digitizing the signal from at least one sensing element of the respective subgroup of sensing elements. It is an advantage of embodiments of the present invention that analog-to-digital conversion can be done per tile, rather than per pixel, in a parallelized way.

In some embodiments of the present invention, the at least one waveguide comprises a single waveguide crossing each tile of the sensor, wherein the plurality of modulators are adapted for modulating at least one optical signal travelling within the waveguide. It is an advantage of embodiments of the present invention that a single input optical fiber and a single output fiber are needed.

The present invention is not limited to a single waveguide. In some embodiments of the present invention, the sensor stack comprises a plurality of waveguides. Each of the plurality of modulators are adapted for modulating at least one optical signal travelling within at most one waveguide of the plurality of waveguides. It is an advantage of embodiments of the present invention that modulation can be performed with less modulation wavelengths, providing several inputs and outputs. For example, robust data manipulation can be obtained.

In some embodiments of the present invention, the electronics layer comprises through-silicon vias for bonding to the photonics layer. It is an advantage of embodiments of the present invention that sensing elements, read-out circuits and photonic arrays can be separately manufactured in dedicated plants and fabs, and can be independently assembled by standard routes.

In some embodiments of the present invention, the photonics layer comprises through-oxide vias for connection to an external device or board via solder balls. It is an advantage of embodiments of the present invention that low parasitic capacitance is introduced.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
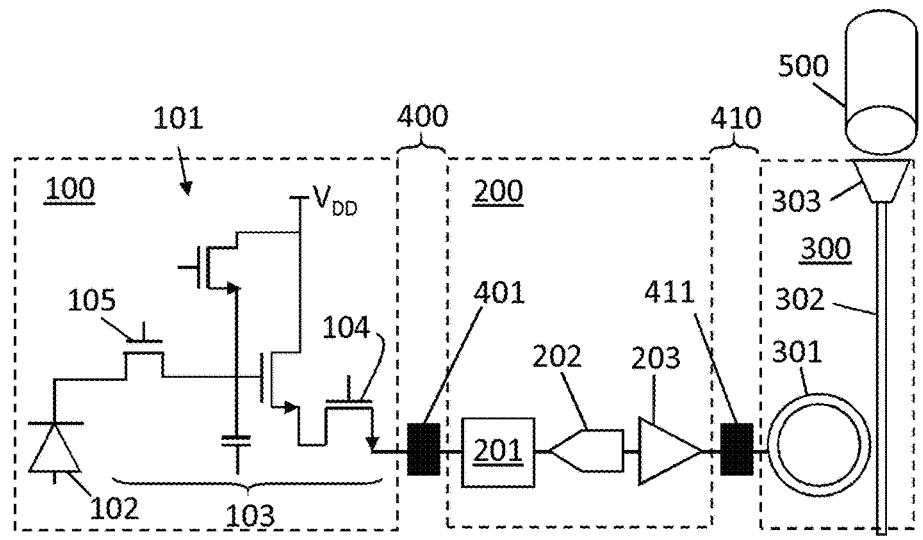
FIG. 1 schematically illustrates the components of layers of a tile according to embodiments of the present invention.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to "sensing element", reference is made to an element which accepts radiation and gives a measurable response. Typically, the sensing element comprises a photosensitive surface, typically a photoelectric surface, in which the measurable response is generation of charges. The present invention is not limited to purely photoelectric elements, however. A sensing element is usually linked to elements for extracting the response from the sensing element and sending it to a further processing unit. For example, these elements may include gates, floating diffusion nodes or charge storage nodes, wiring, connections, etc. The response-handling elements and the sensing element are referred to as "pixel" in the present description. Typically, a pixel comprises at least one photodiode and a pixel circuit for reading out the charge generated in the at least one photodiode.

3D integration and back side illumination (BSI) are important technologies for high-performance high-speed imaging and data treatment, for example for scientific applications. In accordance with embodiments of the present invention, not only a pixel layer and an electronics layer are provided in a 3D stack, but also a photonics layer comprising at least one radiation transmission path, e.g. a waveguide, and one or more modulators, each connected via connecting means to a readout circuit of the electronic layer, and adapted for modulating an optical signal travelling within the at least one radiation transmission path, e.g. waveguide. Such structure reduces complexity and power consumption, while achieving a very high data rate by coupling information into waveguides and/or optical fibers.

In embodiments of the present invention, a plurality of pixels is provided. The signal generated by the sensing elements of these pixels are read out in groups or subsets. Instead of outputting the data of these subsets electronically, the signal generated is converted into signals which can be used to control light modulation. In what follows, these signals receive the name of "information signals". For example, they can be used to modulate radiation through a radiation transmission path, e.g. waveguide. The output of the stacked sensor according to embodiments of the present invention is a modulated optical signal. In order to enable this, a radiation input/output (e.g. couplers) can be provided in the photonics layer.

In embodiments of the present invention, each subset of (sensing elements of the) pixels generate signals from the received radiation. The signals are converted in the electronics layer into information signals, for example comprised in a code. The code of every subset of pixels is applied, via a modulator, to the radiation passing through an optical link or radiation transmission path, e.g. waveguide, in the photonics layer. The readout of the modulated radiation from the photonics layer is interpreted as data, the data being representative of the light detected by each of the pixels. The readout may comprise readout of a single radiation transmission path, e.g. waveguide, which would be modulated according to each subset of pixels of the sensor. In other embodiments, the readout may comprise readout of several radiation transmission paths, e.g. waveguides, each of which is modulated according to at least one subset of pixels. The readout can be done via several techniques, for example via existing multiplexing techniques.

In a first aspect, the present invention relates to a sensor device comprising an array of tiles, each tile comprising stacked functional layers. The layers are arranged on top of each other. The elements in the first layer, or sensing layer, provide a plurality of signals upon excitation, which are sent to a second layer for processing.

Thus, the stacked image sensor comprises a plurality of sensing elements or pixels, divided in subsets of sensing elements or pixels, each subset comprised in a tile.

The second layer of the tile, or electronics layer, can receive and process the signals from each sensing element of the subset of sensing elements of the sensing layer, so the sensing layer does not need to waste sensing area by including peripherals or electronics: some or all electronic elements may be included in the electronics layer. In embodiments of the present invention, a readout circuit (ROC) is arranged to receive the signals from each sensing element in the tile, for further processing. Thus, a stacked image sensor may comprise at least as many ROCs as tiles. The ROCs comprise connections adapted to send the processed signals to a third layer in the tile, the third layer comprising opto-electronic elements which can control and modulate radiation passing through an optical guide, based on the information signals received from the second layer. The second layer (electronics layer) is usually sandwiched between the first layer (pixel layer) and third layer (photonics layer) in a tile. This has the additional advantage that the main electronics for signal processing can be shielded from light and thus protected from stray photocharges.

Where in embodiments of the present invention reference is made to a "tile", reference is made to a layered device comprising at least:
a "sensing layer" (or "pixel layer") comprising a subset of a plurality of pixels, the subset comprising less pixels than the total plurality.
one or more "electronics layer", comprising one or more read-out circuits (ROCs), which may be a separated physical substrate or which may be embedded in the wafer comprising the pixel layer. They may also be integrated circuits (ROICs). The ROC comprises circuit elements to process the signal from each pixel and provide information signals. In some embodiments, the pixels of the layer of a particular tile are connected to the ROC of the same tile, but the present invention is not limited to this configuration.
a "photonics layer", comprising at least one opto-electronic modulator, connected to the ROC of the electronics layer so the information signals provided by each electronics layer tile may control a single modulator in the photonics layer.

The tile may be a physical device, such as a layered substrate slab, and the device is formed by an array of tiles abutted sideways against one another. In some embodiments, the tile may comprise a subset of pixels connected to circuitry, the signals of the subset of pixels providing modulation of radiation in a photonics layer, via the electronics layer and a modulator. Each subset would belong to a tile, although all the pixels may be part of a single substrate. The same can be applied to any particular layer. Hence, in some embodiments the "tile" is not a device physically abutted against other tiles, but subsets of elements included in one or more of the layers provided in a single substrate of the device. In this case, the tiles comprise each subset of elements in each layer allowing separation of signal processing and readout of different subsets of pixels.

In some embodiments, a tile comprises a pixel layer connected to one layer comprising electronics. In some embodiments, the pixel layer of a plurality of tiles may be connected to the electronics layer of a single tile, and in alternative embodiments, the pixel layer of a single tile may be connected to one or more electronics layer tile. The sublayers of the tiles, then, can be considered subset of interconnected sensing and electronics elements in a respective substrate.

In embodiments of the present invention, the electronics layer of each tile is connectable or connected to a modulator. Each tile may comprise a single modulator, although the present invention is not limited thereto. For example, the signal may be sent over multiple modulators. For example, the tile may comprise a plurality of modulators. In embodiments of the present invention, the sensor stack comprises an array of layered tiles, each tile comprising the same number of pixels, electronic circuitry adapted to provide modulation of an opto-electronic modulator according to the signals received by the pixel layer, and a single modulator for modulating the radiation in a radiation transmission path, e.g. waveguide.

FIG. 1 schematically illustrates an exemplary tile according to embodiments of the present invention. The tile comprises a sensor array layer, also called pixel layer 100, an electronics layer 200 and a photonics layer 300. The layers of the tile are functionally linked in any suitable way, for instance by direct bonding 400, 410 or by any other 3D integration techniques, such as for instance flip chip, wafer to wafer bonding, by vias, solder bumps, chip to wafer bonding, or a combination of these techniques, the present invention not being limited thereto.

The pixel layer 100 comprises a pixel array, comprising a plurality of pixels 101 each of which comprises a sensing element such as a photodiode 102 and a pixel circuit 103 (comprising for example a select transistor 104, a power line $V_{DD}$, a transfer gate 105 between the photodiode 102 and a floating diffusion node, etc., although the present invention is not limited to a particular pixel circuit configuration. Only one pixel is shown in the layer 100 of FIG. 1 for simplicity, but a plurality thereof are provided in the layer. Each signal from each pixel 101 is output through a connection 401 between the pixel layer 100 and the electronics layer 200. Each pixel 101 may comprise such connection between an output port of the pixel layer 100 and an input port of the electronics layer 200, or a pixel layer 100 of a tile may comprise less connections than the number of pixels present in the tile. In such case, one or more connections may be shared between several pixels, e.g. via the select switch, so no signal is mixed or lost. The connections are adapted to send signals, generated in the sensing elements of a pixel upon impinging radiation, to the electronics layer 200 for processing into a plurality (e.g. a sequence) of information signals. The electronics layer 200 may for example comprise a readout circuit 201, comprising for example elements to perform correlated double sampling (CDS), which may alternatively be provided on the pixel layer. It may comprise also an Analog-to-Digital converter (ADC) unit 202 and a modulator driver 203. Other elements such as amplifiers can be included. The output of the electronics layer 200 are information signals, and an interface connection 411 to the photonics layer 300 is arranged to send these signals to an opto-electric device, including a modulator 301, in the case illustrated a single resonance-ring modulator, although the present invention is not limited to a single modulator nor to a modulator type. Radiation passing through a waveguide 302 can be modulated by the information signals generated in the driver 203 and applied to the modulator 301. In some embodiments, the modulated signal can be coupled in and out, for example it can be coupled to an external radiation carrier 500, such as an optical fiber, via a coupling grating 303. In other embodiments, instead of a coupler 303, the waveguide 302 enters another tile for further modulation. In some embodiments of the present invention, the waveguide is a multimode waveguide, and each modulator is capable of modulating radiation in a narrow range of wavelengths.

Thus, different data sequences generated in each tile (by obtaining the signal from each pixel and generating an information signal therefrom) can be implemented in the same waveguide and read independently and in sequence. However, the present invention is not limited to multimode waveguides, and single mode waveguides can also be used.

Embodiments of the present invention provide a signal from each pixel by known methods, which can be processed as part of a code. The code (comprising information signals) can be used to modulate light through at least one waveguide by means of an optical link and give a fast output.

FIG. 1 shows the signal path from a single pixel 101 to the radiation carrier, e.g. optical fiber 500, but although not pictured, all the signals from all the pixels in the tile follow the path to the same modulator of the tile. In other embodiments, the signals may be applied to more than one modulator in the tile. The electronics in the electronics layer 200 process data in parallel from each subset of sensing elements in each tile. The processed data can be used to modulate in parallel the radiation passing through one or more waveguides 302, thus obtaining a very fast data processing. The data bottleneck for fast information addressing, readout and processing is thus circumvented by including optical links, the light therein being modulated through electronics according to the radiation received in each pixel of the tile, and this in parallel for each tile of the stacked sensor. Thus, the size of the whole sensor is less relevant for the speed of readout, but the size of the tile, which comprises substantially less pixels than the whole sensor, is. The readout of all the tiles can be done simultaneously through the modulated signals in a multimode waveguide. However, alternative implementations can be done using single mode waveguides.

Each layer may be provided in any material suitable for the corresponding function. The sensing layer may for example comprise photosensitive materials, such as semiconductor materials, epitaxial layers thereof, doped semiconductors, photodiodes, pinned photodiodes, etc. The electronics layer may for example be provided in a semiconductor wafer, such as for instance a silicon wafer, comprising wiring, contacts and contact pads, doped and dielectric layers, etc. Some or all elements may be integrated. The photonics layer may for example comprise photonic materials, such as a silicon-on-insulator, waveguides, oxide layers, etc.

In embodiments of the present invention, one layer of several tiles may be provided in a same substrate. For example, several or all the tiles of one of the layers may be integrated in a single layer, e.g. in the same substrate, for example in the same wafer, making manufacture of at least a portion of at least one of the layers easy and following well-known industrial routes. In some embodiments, all the tiles of the stacked device share a single substrate (e.g. a portion of a wafer) in at least one of its layers. For example, the sensing layers of the all the tiles may be provided on a same substrate. In some embodiments, the electronics layer of all the tiles may be provided in a same integrated circuit, or in a same wafer or portion thereof. Analogously, the photonics layers of some or all the tiles may be integrated, e.g. in the same photonics integrated circuit. In some embodiments, two or the three layers may be provided in each respective integrated circuit, e.g. in a respective wafer or portion thereof. In some embodiments, the stacked device is formed by stacking substrates comprising layers of several tiles on top of each other.

Figure 2:
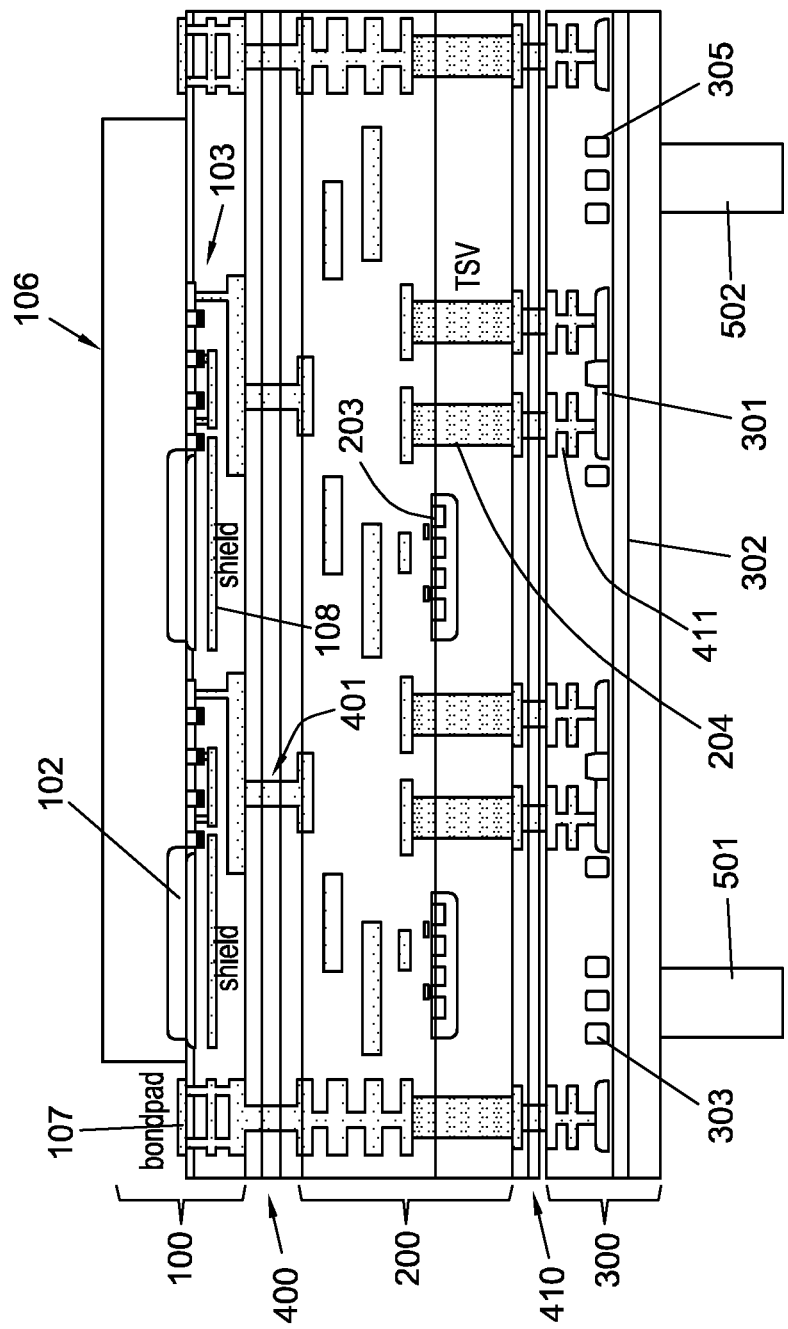
FIG. 2 illustrates a cross-section of an exemplary 3D stack according to some embodiments of the present invention comprising TSV.

A cross-section of an exemplary 3D stack according to some embodiments of the present invention is shown in FIG. 2. It comprises a sensing layer 100, which may be a BSI sensing layer. For example, the sensing layer may comprise a back-side thinned wafer. However, the present invention is not limited to BSI layers, and it may be applied to Front Side Illumination (FSI) configurations.

The cross-section of FIG. 2 shows a single tile (not at scale), illustrating two pixels in the cross-section, but in embodiments of the present invention each tile may comprise many more than two pixels, for example an array of hundreds of pixels, for example 10×10, 100×100, 250×250, 1000×1000 pixels, or in asymmetrical configurations, for example 1000×100 pixels. In the example illustrated, each pixel comprises a photodiode 102, for example a pinned photodiode. The sensing layer 100 may further comprise other elements, such as some or all elements of the pixel circuit 103 (as also illustrated in FIG. 1), or of alternative pixel circuitry (not illustrated). The radiation-receiving surface 106, e.g. light-receiving surface, may be covered by anti-reflecting coating (ARC), glass or any other suitable material (not illustrated), so as to allow entering radiation, e.g. light, into the sensing region with low losses. A bondpad 107 can be included in the pixel layer, for attaching to e.g. a package. The bondpad may be on the pixel layer, but outside the pixels, and/or outside the light-receiving surface 106. Bondpads may alternatively or additionally be included in the surface of the photonics layer opposite to the one facing the electronics layer (as seen for example attached to a bump 307 in FIG. 3), even in the pixel. The device of the present invention allows bonding flexibility.

The stacked sensor further comprises an electronics layer 200, for example comprising readout circuits (ROCs), for example readout integrated circuits (ROICs). The electronics layer 200 may further comprise other elements such as clocks, oscillators, regulators, analog-to-digital converters (ADCs), amplifiers and other elements which allow the signals from each sensing element (e.g. charges generated in each photodiode) of the sensing layer 100 to be converted to information signals, which via a modulator driver 203 allow producing a modulated signal in an optical waveguide, the modulation being dependent on the intensity of light detected by each pixel. The elements of the electronics layer 200 will be discussed in more detail with reference to FIG. 4.

The electronics layer 200 is bonded to the sensing layer 100. For example, direct bonding 400 can be provided. Connections 401 to row and column wires can be made through the array. Metal-metal bonding can be used as one particular example, or in any other suitable way.

The electronics layer 200 is connected to the photonics layer 300 of the tile. Specifically, the output of the circuits of the electronics layer 200 (e.g. the output of the modulator drivers 203) is connected to an opto-electronic modulating element 301 in the photonics layer 300, so that the information signals can be sent through these connections. Vias can be provided through the substrate of the electronics layer 200 for electrically connecting with the sensing layer 100 and/or the photonics layer 300. For example, through-silicon vias (TSV) 204 can be embedded in the substrate (e.g. wafer) of the electronics layer 200, for bonding to the wafer of the photonics layer 300. The bonding between the electronics layer 200 and the photonics layer 300 may also comprise a direct bonding 410 and may comprise interface connections 411 for sending the information signals from the ROIC to the modulators 301.

The photonics layer 300 may comprise any suitable photonics material or combination thereof, e.g. it may comprise SOI photonics. The photonics layer 300 comprises at least one opto-electronic modulator 301 and at least one optical path for radiation, e.g. a radiation transmission path 302, which may be a waveguide, such as a planar waveguide, or more than one. The at least one optical path 302 is arranged with respect to the at least one modulator 301 of the photonics layer 300 such that the radiation, e.g. light, through this path (or waveguide) can be modulated. For example, the modulators 301 may be adjacent to the optical path 302. The waveguide 302 can be provided across several tiles. Some tiles may also comprise couplers 303, for example coupler gratings, for interchanging radiation with an external source. For example, a tile in the border of the sensor may comprise a coupler 303 for introducing radiation into the waveguide 302 of the photonics layer 300, and the same of another tile may be provided with a coupler 305, for extracting radiation from the waveguide 302 to the outside. The waveguide 302 may extend across a plurality of tiles, which do not need to comprise couplers. In the embodiment of FIG. 2, the radiation is interchanged via couplers 303, 305 with an external radiation carrier, such as an optical fiber, e.g. an input optical fiber 501 and an output optical fiber 502.

Impinging radiation enters the wafer through the radiation-receiving surface, e.g. light-receiving surface 106. Impinging radiation, e.g. light, is converted into photocharges in the photodiodes 102, and the generated charges are sent via the pixel circuit 103 (e.g. via gates and transistors, through floating diffusion nodes and/or capacitors), to connections 401 which are directly connected to the electronics layer 200. The circuits in the electronics layer are adapted to generate an information signal, based on the received charges, and thus based on the signal read from the pixels. For example, the information signals may comprise a sequence of voltage levels, each voltage level being representative of the signal received in the respective pixel. Any other suitable type of signal can be used. For example, the signal may be an analog or a digital signal (e.g. obtained using A/D conversion), or any other suitable type of electric signal. Charges from each pixel can be temporally stored and read sequentially. Any additional information (for example information related to the sequence at which the pixels are read) can also be implemented in the code, and/or by multiplexing, so no information is lost. The obtained information signal is applied to the opto-electronic modulators 301, which apply the signals on radiation, e.g. light, passing through the radiation transmission path, e.g. waveguide 302, through the tile. Radiation through the radiation transmission path, e.g. waveguide, can thus be modulated in accordance with the information signals, which in turn depend on the radiation received by each sensing element.

Figure 3:
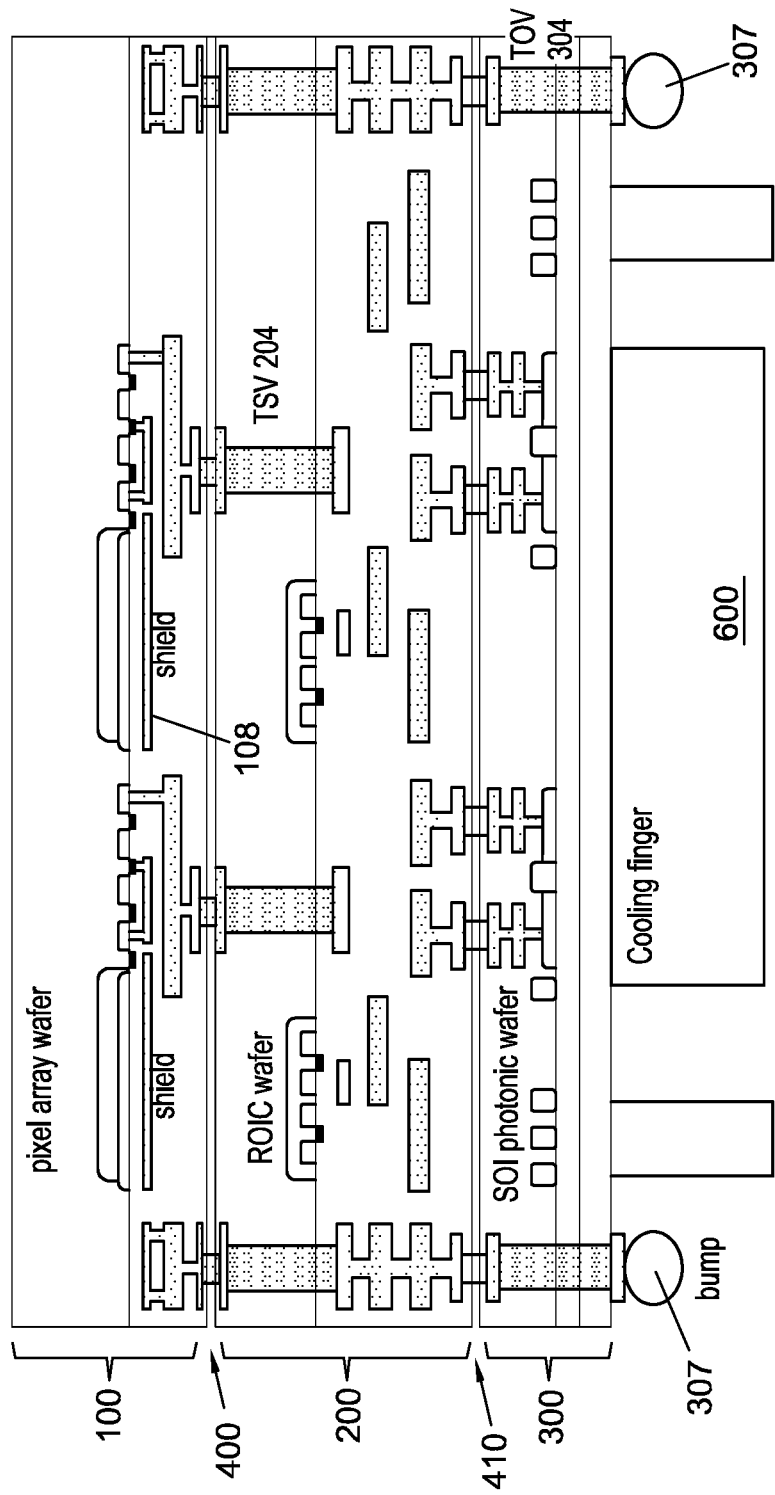
FIG. 3 illustrates a cross-section of an exemplary 3D stack according to some embodiments of the present invention comprising TOV and connection bumps.

FIG. 3 shows another embodiment of a stacked image sensor according to embodiments of the present invention, with optional features. It can be seen that the electronics layer 200 is flipped compared to the electronics layer 200 in the embodiment of FIG. 2. This means that the TSV's 204 in the electronics layer 200 of the stack of FIG. 3 directly bind circuitry in the electronics layers 200 to the sensing layer 100, rather than to the photonics layer 300 as in FIG. 2. Furthermore, the photonics layer 300 is provided with through-oxide vias (TOV's) 304 for making vertical electrical connections through the thickness of the insulating material, typically oxide, of the photonic layer 300. The photonics layer 300 as illustrated in the embodiment of FIG. 3 further comprises bonds, bumps 307 or in general elements for bonding to a package, to an external circuit, etc. For example, the photonics layer 300 may comprise TOV 304 for interconnection to a package, or a PCB, or the solder bumps thereof, etc. A TOV may provide e.g. low parasitic capacitance.

Additional features can be included in a sensor stack according to embodiments of the present invention. For example, the sensing layer 100 may comprise radiation shields 108 underneath the sensing elements 102, for preventing impinging radiation to be lost and not collected. In same or alternative embodiments, a thermal sink 600 in thermal contact with the photonics layer 300 can be added, such as a cooling finger. Such thermal sink 600 prevents heating of the stacked image sensor according to embodiments of the present invention.

Figure 9:
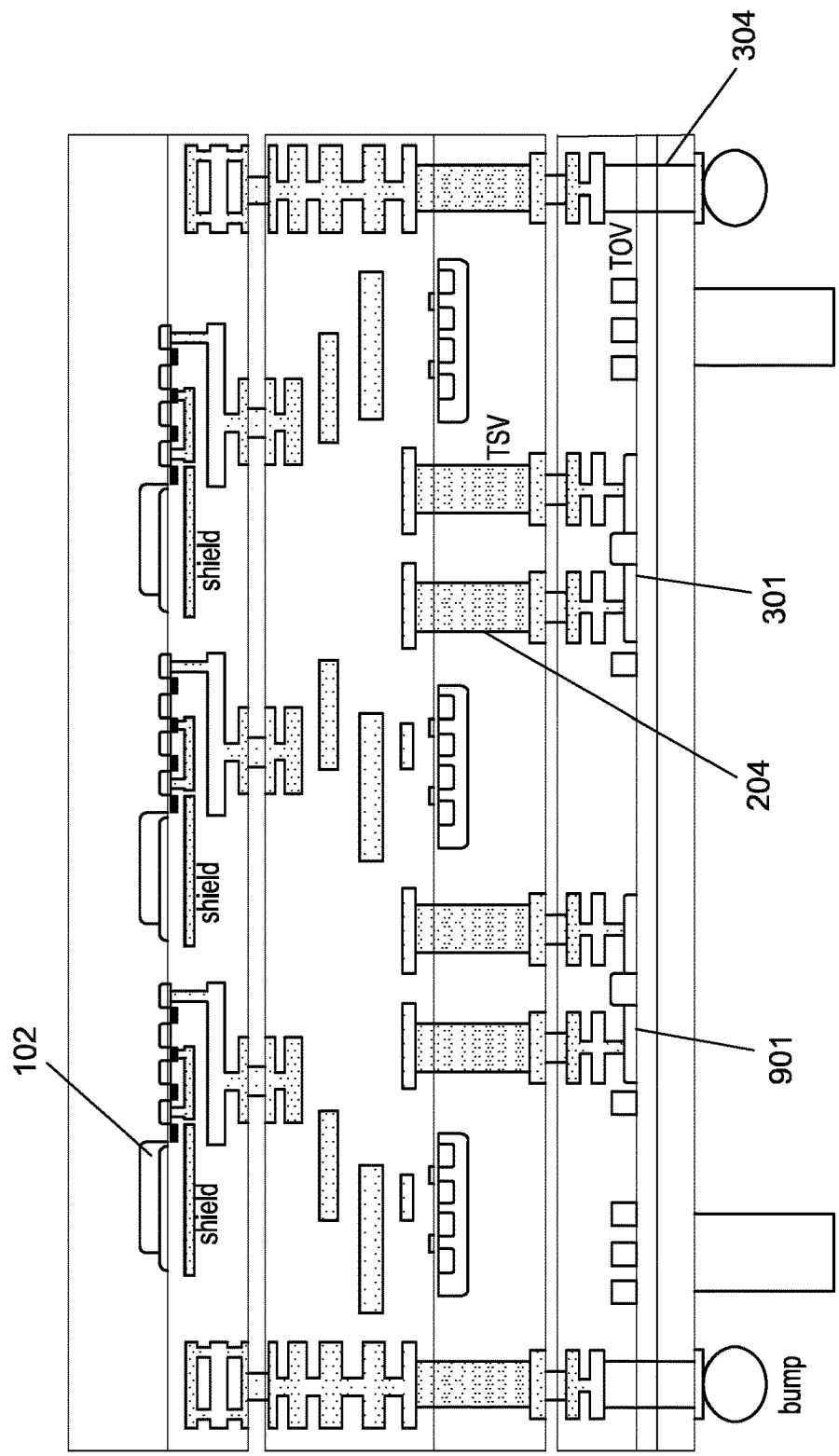
FIG. 9 illustrates a cross-section of another exemplary 3D stack according to some embodiments of the present invention, comprising TSVs and TOVs.

FIG. 9 shows another embodiment of a stacked image sensor according to the present invention, illustrating TSV 204 and TOVs 304. In this particular embodiment, the cross section shows three photodiodes 102 (e.g. PPD) per tile, but many more can be included. The readout of each can be converted into control signals for the modulators 301, 901 of the photonics layer. The number of pixels may be much larger, and the modulators may be more than one in a single tile. For example, as shown in the figure, two modulators 301, 901 may be included in the same tile. They may for instance be ring resonator modulators (RRMs) 301 or Mach-Zehnder modulators (MZMs) 901. They may even be a combination of several types of modulators, as illustrated in FIG. 9. A set of signals generated from a subgroup of sensing elements of the tile may drive one modulator, and a different set (e.g. comprising signals from different sensing elements, such as elements with a color or wavelength filter) may drive another modulator in the same tile, improving parallelization. Alternatively, the same set of signals can be used to drive two modulators in the same tile.

The present invention provides grouping of several pixels into a sensing layer 100 of a tile, which pixels provide a signal in response to the radiation falling in each element on the sensing layer of the tile. A sensing layer of a single tile may comprise at least 100 pixels, for example 250×250 pixels, and a stacked sensor may comprise at least 2 tiles, for example 2×2 (four tiles), or 4×4 tiles, or for example 10×10 tiles. However, these are only exemplary values, and other values can be used. For example, between 5 and 10% or even between 1% and 50% of the total number of pixels in a sensor may be included in each tile. The sensing layer of a tile may comprise pixels over its whole area, because the drivers do not need to be on the surface area, and the connections to the select and data lines (e.g. the row and column wires) can be made in the array. Although at least some pixels at the edges of the tile are contiguous to other pixels at the edge of adjacent tiles, signal and control wires can be interrupted at the tile boundaries. The electronics layer 200 can provide an information signal, or a plurality thereof, or e.g. a sequence of information signals, based on the signals received from the sensing layer 100 of the same or another tile, and at least one opto-electronic modulator of the photonic layer 300 of the same or another tile can in turn control the radiation through the radiation transmission path, e.g. light guide, in accordance with the information signal or signals. Hence, parallelization can be obtained by simultaneously processing signals obtained from several or all sensing tiles of the sensor stack of the present invention. This way, no information is lost, because the ROCs extract data from each pixel, and each piece of data is used to modulate the modulator of the photonics layer, for each tile.

In some embodiments of the present invention, each modulator can modulate radiation at a narrow wavelength range in the radiation transmission path, e.g. waveguide. The radiation transmission path, e.g. waveguide, can transmit signals in a wide range of wavelengths, and modulators can provide any suitable modulation known in the art such as pulse width modulation, or amplitude modulation, binary modulation, etc., e.g. in a specific wavelength (or more exactly, a specific narrow range of wavelengths) in accordance with the information signals. The information signals are in turn determined by the pixel signals generated by impinging radiation. This processing and reading of the output of the radiation transmission path, e.g. waveguide, can be made through wavelength-division multiplexing (WDM) or any other suitable way (such as time-division multiplexing (TDM) or frequency-division multiplexing (FDM)). In embodiments of the present invention, the tiles can be read simultaneously through the modulated signals.

In general, the radiation received by the photosensitive elements can be converted into a pulse sequence through the radiation transmission path, e.g. waveguide. For example, the signals from each pixel can be used to form a pulse sequence to control the modulators, which in turn apply the sequence to the radiation in the waveguide.

The signals can be read directly from each pixel by a connection to a plurality of readout circuits, or by connecting several pixels to a single readout circuit and by sequentially reading the signal generated in each pixel. Clocking elements can be used. The sequence generated in the electronics layer 200 is uniquely determined by the radiation intensity falling in each pixel, so no information is lost, integrated or averaged (although it would be possible to do so, if desired). In some embodiments, electronic means, memories and clocking devices are included in order to regulate the readout of each pixel through a connection and assign it to a predetermined part of a modulation sequence of a plurality of information signals. Combinations of multiple sequences in several modulators along the same waveguide can be read, for example by multiplexing.

Figure 4:
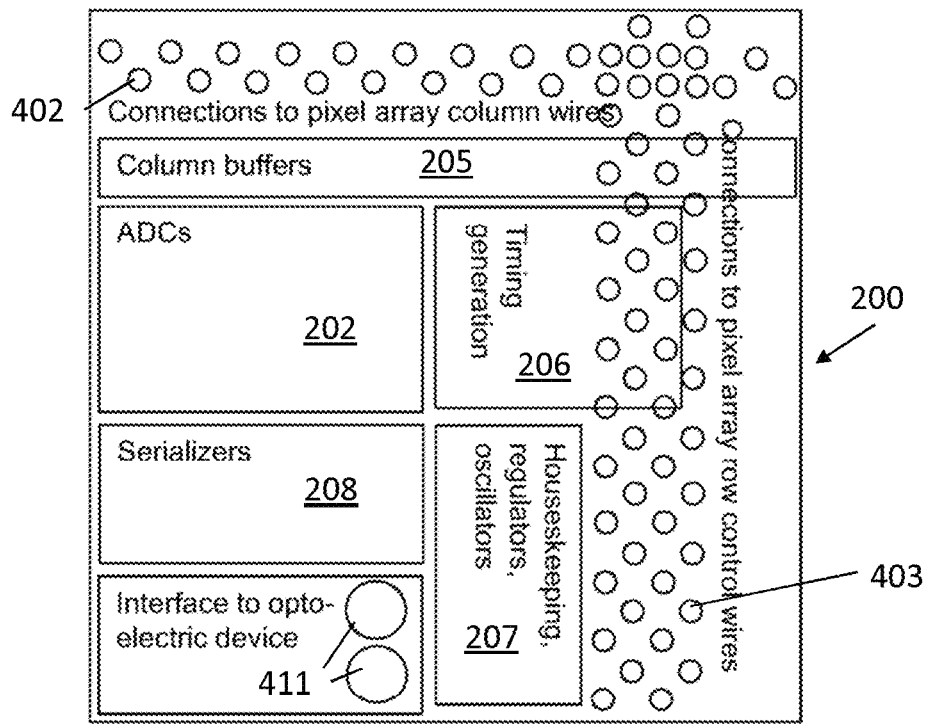
FIG. 4 illustrates the electronics layer of a particular tile according to some embodiments of the present invention.

FIG. 4 shows the electronics layer 200 of a particular tile. It comprises connections to the sensing layer, specifically connections 402 to pixel array column wires, as well as connections 403 to the pixel array row control wires. Because the pixel layer 100 of each tile is covered by sensing elements over the full surface, the connections to the row and column wires have to be done within the layer. Circuit elements adapted to receive a signal generated by the pixels, and to process these signals for generating a modulating information signal, are included. These elements may comprise one or more ADC units 202, e.g. comprising one or more ADCs, and other auxiliary electronics (e.g. amplifiers, column buffers 205, timing generators 206, housekeeping unit 207, serializers 208, etc). The information signal can be sent, via the interface 411, to the opto-electronic device 301 of the photonics layer 300 in order to modulate radiation in the waveguide 302 and obtain an output based on the radiation impinging on the sensing elements.

Figure 5:
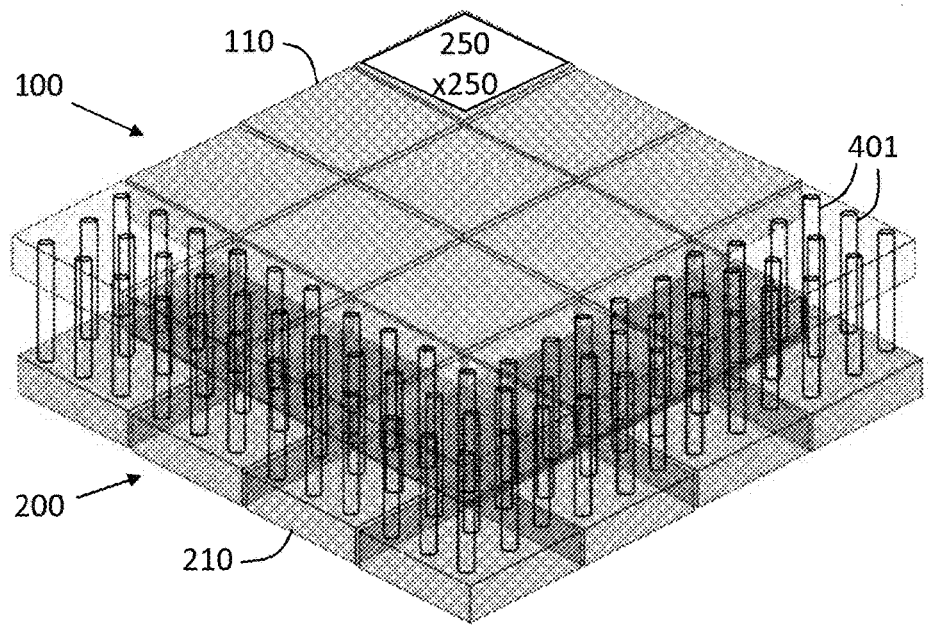
FIG. 5 illustrates an array of tiles showing the sensing layer and electronics layer, highlighting the connections between the two layers, for an exemplary embodiment of the present invention.

FIG. 5 shows the connections between the sensing layer 100 and the electronics layer 200 for an array of tiles in an exemplary embodiment of a 3D stacked image sensor. For example, the image sensor may comprise 1000×1000 pixels, divided into sixteen tiles. The sensing layer would be divided in sixteen pixel layer tiles 110. Each pixel layer tile 110 would then comprise an array of 250×250 pixels. The sensing area of a sensor according to embodiments of the present invention can fill the complete area of a wafer, or part thereof. This means that the size of the imager may be arbitrarily chosen according to specific needs, and it is only limited by the size of the wafer itself. The electronic layer 200 is also divided in electronics layer tiles 210, each electronics layer tile comprising circuit elements for signal processing. The connections 401 between the pixel layer 100 and the electronics layer 200 in each tile may be sparse, not per-pixel, but still inside the pixel array. These connections 401 may comprise connections to pixel array column wires, connections to the array row control wires, etc.

Figure 6:
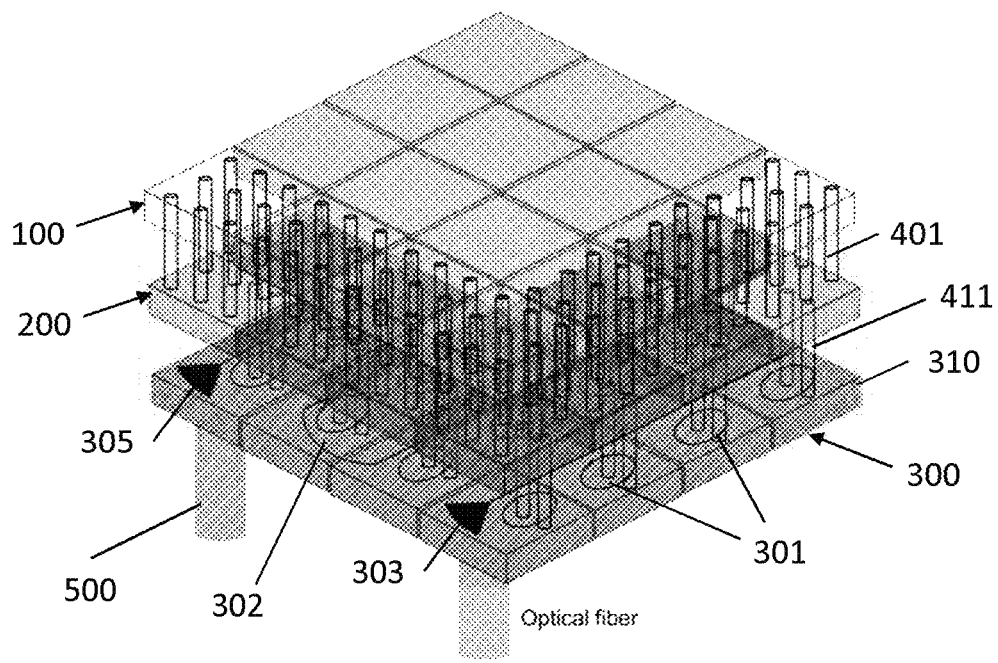
FIG. 6 illustrates an array of tiles showing the three layers (sensing layer, electronics layer, photonics layer), highlighting the connections between them, for an exemplary embodiment of the present invention.

The tiles forming the mosaic of FIG. 5 and FIG. 6 are square, but other shapes can be used according to the specific needs of the sensor array; for example, in a stack comprising 10×1000 pixels, the tiles may be rectangular. Any other shapes, including irregular shapes, can be used.

FIG. 6 further shows the connections between the electronics layer 200 and the photonics layer 300, of the exemplary embodiment of FIG. 5. Each electronics layer tile 210 is connected, via interface connections 411, to an opto-electronic modulator 301 in each of the sixteen photonics layers tiles 310. Modulation of the output radiation can be obtained in any suitable way. Commonly used techniques for opto-electronic links can be used, such as VCSELs, Mach-Zehnder modulators (MZM), or ring-resonator modulators (RRM), or even several types of modulators can be used in the same or in different tiles. In some embodiments of the present invention, RRMs are used, which are easy to integrate in semiconductor devices. Specifically, for Si-based CMOS processing, RRM are readily obtainable, which is not the case of for example VCSELs. The bandwidth and maximum power levels are not as limited as in VCSEL technology, either. Further, RRMs may present a small area and good efficiency, compared to other modulators such as MZMs. In some embodiments of the present invention, the readout is performed by WDM, which can be easily implemented by cascading RRMs. However, MZMs may be used as well, as explained before with reference to FIG. 9, and in such case the electronics layer 210 can directly provide control of the electrodes of the modulators.

In the embodiment of FIG. 6, a single waveguide 302 is shared by all the photonics layer tiles 310, so each modulator controls the radiation through the same waveguide. Only two couplers 303, 305 are thus necessary, one for input and one for output to the external radiation carrier 500 (e.g. the optical fiber). This photonic layer layout is shown in FIG. 7.

Figure 7:
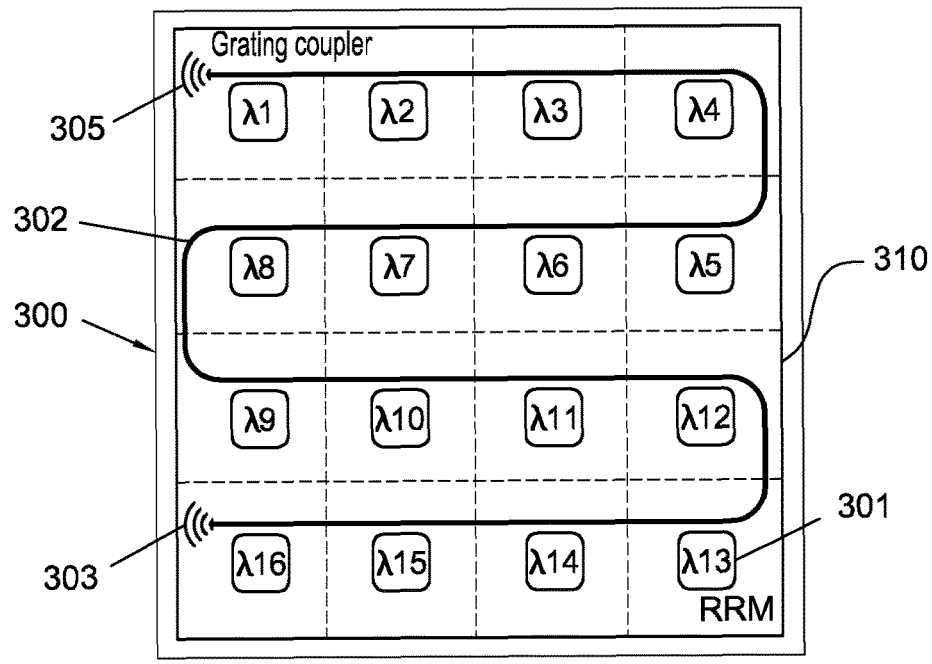
FIG. 7 illustrates an array of tiles showing only the photonics layer of the embodiment of FIG. 6, comprising a single optical path.

Specifically, FIG. 7 shows only the photonics layer 300, separated in tiles 310, of the embodiment of FIG. 6. The architecture of modulators accordingly comprises 16 RRMs 301, one provided per tile. In this case, all RRM are in series and are adapted to modulate the radiation through a single waveguide 302, which can present zig-zags, or a sinuous or meandering shape in order to pass through each tile 310 of the array. In these cases, only two couplers 303, 305 are needed. The waveguide 302 may be a multimode waveguide through which radiation with different wavelengths, or a range thereof, can travel. Each modulator 301 is adapted to modulate radiation in a specific wavelength distinct from each other, in accordance with the signals obtained from each pixel. For example, a sequence of pulses comprising information regarding pixel position and intensity of impinging radiation can be provided. Readouts of sequences applied to sixteen different wavelengths (or narrow wavelength ranges) are obtained, one for each tile 310, using a single waveguide 302, for example sequentially.

Figure 8:
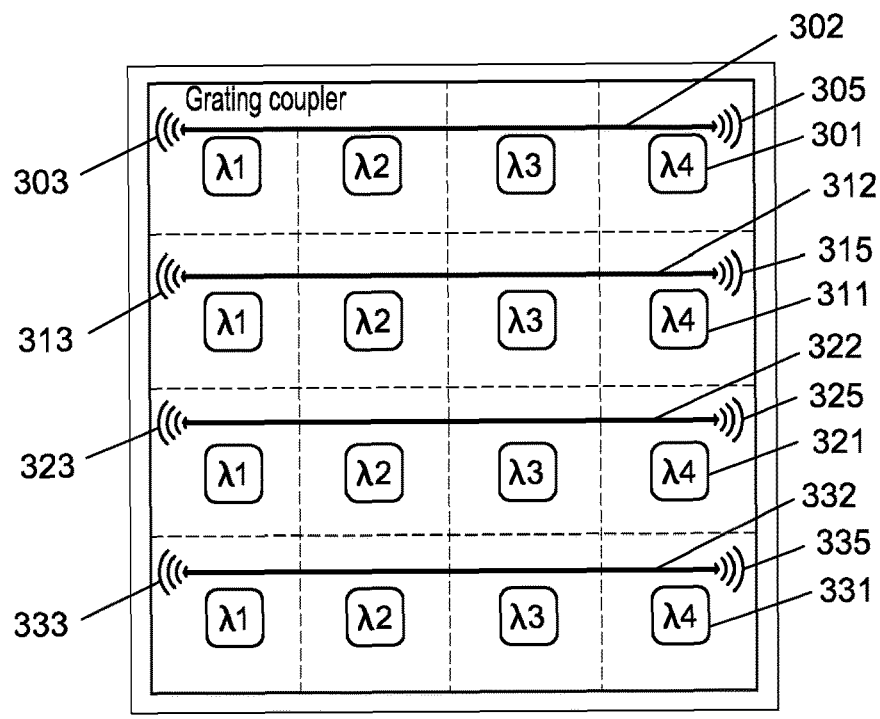
FIG. 8 illustrates an alternative array of tiles showing only the photonics layer of a particular embodiment of the present invention, comprising a plurality of optical paths.

FIG. 8 shows a different architecture. Each row of the tile array shares a common bus waveguide 302, 312, 322, 332, so the present embodiments comprises as many waveguides as there are rows in the array. Each waveguide is arranged together with the RRMs 301, 311, 321, 331 so modulation can be provided therein. In this case, an input and output for each radiation waveguide 302, 312, 322, 332 can be provided, such as couplers 303, 313, 323, 333 for coupling radiation in and couplers 305, 315, 325, 335 for coupling radiation out of four input, resp. output optical fibers (not shown). Because, this way, four different readings are obtained, the same type of modulators can be used in each row (the type of modulator being determined by the wavelength of radiation the modulator provides modulation for), while still obtaining an unambiguous reading of radiation impinging in each tile. This allows providing modulation at wavelengths with bigger separation between each other, obtaining good multiplexing with low cross-talk. In this case, optical signals are introduced through each grating 303, 313, 323, 333. Each modulator implements information from the signals of the pixel layer 100 in the optical signals. The information is implemented for example by sequentially modulating the optical signal in a wavelength band. The signal is extracted and analyzed for each wavelength at which modulators apply modulation, so the information regarding the position of the tile in the array is unambiguous. In FIG. 8, four analyses should be done (e.g. with four analyzers), which may be in parallel. On the other hand, in FIG. 7, only one analysis is needed, but it is performed in sixteen narrow ranges of wavelengths, rather than in four. FIGS. 7 and 8 show a single waveguide and a single modulator per tile, which results in a compact layout. However, the present invention is not limited thereto. For example, in some embodiments, more than one modulator may be included in a tile.

The present invention can also be seen as a sensor comprising an array of tiles comprising subtiles. The subtiles at the top level comprise a plurality of sensing elements. The radiation impinging on each subtile of the top level generates a plurality of signals, a signal per sensing element. These signals are sent to readout circuitry in a lower level layer, which may be also separated in tiles at intermediate level. The signals are used to generate a code containing information regarding e.g. intensity of light and position of the sensing element in the top subtile. The code is introduced in a radiation transmission path, e.g. a waveguide, via a modulator. Information regarding intensity of impinging radiation and position in the top subtile is thus introduced in the radiation transmission path, e.g. waveguide. The radiation transmission path, e.g. waveguide, and modulators are arranged so that it can be inferred which subtile provided a particular code. This can be done by providing modulation in a narrow range of wavelengths in a multimode waveguide, each narrow range being characteristic of each modulator of the tile in the array. A different wavelength modulation can be provided per modulator with a single radiation transmission path, e.g. waveguide, or several radiation transmission paths, e.g. waveguides, can be provided. For example, for 16 tiles and one waveguide, 16 different modulator types are needed (1×16). If four waveguides are provided, sixteen modulators are needed of four different modulator types (4×4). These are the two respective examples shown in FIG. 7 and FIG. 8. Other possibilities may be envisioned, such as two waveguides and sixteen modulators of eight different types (2×8). Different number of types can be provided with similar arrangements. The obtained stacked sensor may be completely integrated and modular, as the number of tiles can be expanded.

The invention claimed is:

1. A stacked image sensor comprising an array of tiles, each tile comprising:
   a sensor array layer tile comprising a plurality of sensing elements for receiving radiation,
   one or more electronics layer tiles comprising at least one read-out circuit, the at least one read-out circuit connected to at least one subgroup of sensing elements of the sensor array layer tile,
   a photonics layer tile comprising at least one waveguide and one or more modulators, each of the at least one waveguide and the one or more modulators being connected to the one or more electronics layer tiles, the one or more modulators being adapted for modulating an optical signal traveling within the at least one waveguide,
   each of the one or more electronics layer tiles comprising at least one driver for driving a modulator of the one or more modulators in the photonics layer tile in accordance with signals received in each sensing element of the sensor array layer tile, and
   at least one of the sensor array layer tile, the one or more electronics layer tiles, and the photonics layer tile being integrated in a single layer.

2. The stacked image sensor of claim 1, wherein the at least one waveguide further comprises optical couplers for coupling radiation to and from at least one radiation carrier.

3. The stacked image sensor of claim 2, wherein the at least one waveguide is a waveguide integrated in a photonics platform and further comprises grating couplers for incoupling radiation from an input optical fiber and for outcoupling radiation into an output optical fiber.

4. The stacked image sensor of claim 1, wherein each tile of the array comprises an electronics layer tile stacked on top of a respective photonics layer tile in equally sized, aligned tiles.

5. The stacked image sensor of claim 1, wherein each tile of the array comprises a sensor array layer tile stacked on top of a respective electronics layer tile in equally sized, aligned tiles.

6. The stacked image sensor of claim 1 wherein the sensor array layer tile comprises less connections to an electronics layer tile than a total number of pixels in the sensor array layer tile, two or more pixels of the sensor array layer tile sharing a connection to the electronics layer tile, each pixel comprising select switch means for pixel addressing from the electronics layer tile.

7. The stacked image sensor of claim 1, further comprising connections to row and column drive lines of the plurality of sensing elements inside the sensor array layer tile.

8. The stacked image sensor of claim 1, wherein the plurality of sensing elements cover substantially a whole area of a surface of a respective sensor array layer tile.

9. The stacked image sensor of claim 1, wherein the one or more electronics layer tiles are stacked and directly bonded to respective sensor array layer tiles and to respective photonics layer tiles.

10. The stacked image sensor of claim 1, wherein the one or more modulators are Mach-Zehnder modulators, ring resonator modulators, or a combination thereof.

11. The stacked image sensor of claim 1, wherein the photonics array tile is implemented in a silicon-on-insulator photonics wafer.

12. The stacked image sensor of claim 1, wherein the at least one read-out circuit comprises converters for digitizing a signal from at least one sensing element of a respective subgroup of sensing elements.

13. The stacked image sensor of claim 1, wherein the at least one waveguide comprises a single waveguide crossing each tile of the image sensor, wherein the one or more modulators are adapted for modulating at least one optical signal traveling within the single waveguide.

14. The stacked image sensor of claim 1, wherein the at least one waveguide comprises a plurality of waveguides, wherein each of the one or more modulators are adapted for modulating at least one optical signal traveling within at most one waveguide of the plurality of waveguides.

15. The stacked image sensor of claim 1, wherein each of the one or more electronics layer tiles comprises through-silicon vias for bonding to the photonics layer tile.

16. The stacked image sensor of claim 1, wherein the photonics layer tile comprises through-oxide vias for connection to an external device or board via solder balls.

* * * * *